United States Patent
Yang et al.

(10) Patent No.: US 9,965,097 B2
(45) Date of Patent: May 8, 2018

(54) PIXEL DRIVING CIRCUIT, DISPLAY PANEL, METHOD FOR DRIVING DISPLAY PANEL, AND DISPLAY DEVICE THAT COMPENSATES FOR THRESHOLD VOLTAGE DRIFT AND VOLTAGE FLUCTUATION OF A TOUCH DRIVING SIGNAL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Hailin Xue, Beijing (CN); Haisheng Wang, Beijing (CN); Xiaochuan Chen, Beijing (CN); Hongjuan Liu, Beijing (CN); Tuo Sun, Beijing (CN); Lifei Ma, Beijing (CN); Yingming Liu, Beijing (CN); Weijie Zhao, Beijing (CN); Changfeng Li, Beijing (CN)

(73) Assignees: BOE TECHNOLOGY GROUP CO., LTD. (CN); BEIJING BOE OPTOELECTRONICS TECHNOLOGY CO., LTD. (CN)

( * ) Notice: Subject to any disclaimer, the term of this patent is extended or adjusted under 35 U.S.C. 154(b) by 0 days. days.

(21) Appl. No.: 15/309,316

(22) PCT Filed: Mar. 1, 2016

(86) PCT No.: PCT/CN2016/075117
§ 371 (c)(1),
(2) Date: Nov. 7, 2016

(87) PCT Pub. No.: WO2017/054408
PCT Pub. Date: Apr. 6, 2017

(65) Prior Publication Data
US 2017/0269783 A1 Sep. 21, 2017

(30) Foreign Application Priority Data
Sep. 28, 2015 (CN) .......................... 2015 1 0628000

(51) Int. Cl.
*G06F 3/041* (2006.01)
*H01L 27/32* (2006.01)
(Continued)

(52) U.S. Cl.
CPC ............ *G06F 3/0418* (2013.01); *G06F 3/047* (2013.01); *G06F 3/0412* (2013.01);
(Continued)

(58) Field of Classification Search
CPC ...... G06F 3/0412; G06F 3/0418; G06F 3/047; G09G 3/30; G09G 3/32; G09G 3/3208;
(Continued)

(56) References Cited

U.S. PATENT DOCUMENTS 7,944,415 B2    5/2011    Jang et al.
9,269,300 B2    2/2016    Yang et al.
(Continued)

FOREIGN PATENT DOCUMENTS

CN    102708819 A    10/2012
CN    103383831 A    11/2013
(Continued)

OTHER PUBLICATIONS

First Office Action for Chinese Application No. 201510628000.0, dated Mar. 1, 2017, 8 Pages.
(Continued)

*Primary Examiner* — Keith Crawley

(74) *Attorney, Agent, or Firm* — Brooks Kushman P.C.

(57) ABSTRACT

The present disclosure provides in some embodiments a pixel driving circuit, a display panel, a method for driving the display panel, and a display device. The pixel driving circuit includes a preset unit, a driving unit, a compensation unit, an energy storage unit, and a driving signal output unit.

18 Claims, 7 Drawing Sheets

(51) Int. Cl.
*G06F 3/047* (2006.01)
*G09G 3/3241* (2016.01)
*G09G 3/3258* (2016.01)
*G09G 3/3291* (2016.01)
*G09G 3/3266* (2016.01)

(52) U.S. Cl.
CPC ......... *G09G 3/3241* (2013.01); *G09G 3/3258* (2013.01); *G09G 3/3266* (2013.01); *G09G 3/3291* (2013.01); *H01L 27/323* (2013.01); *G09G 2300/0426* (2013.01); *G09G 2320/0233* (2013.01)

(58) Field of Classification Search
CPC .. G09G 3/3241; G09G 3/3258; G09G 3/3266; G09G 3/3291; G09G 2300/0426; G09G 2300/0819; G09G 2310/0251; G09G 2320/0233; G09G 2320/045; H01L 27/32; H01L 27/323
See application file for complete search history.

(56) References Cited

U.S. PATENT DOCUMENTS

| | | |
|---|---|---|
| 2007/0040772 A1 | 2/2007 | Kim |
| 2011/0134100 A1 | 6/2011 | Chung et al. |
| 2014/0225878 A1 | 8/2014 | Shih et al. |
| 2016/0117983 A1 | 4/2016 | Li et al. |
| 2016/0203794 A1* | 7/2016 | Lim ..................... G09G 3/3225 345/213 |
| 2016/0284269 A1* | 9/2016 | Sun ..................... G09G 3/3233 |
| 2017/0069263 A1 | 3/2017 | Hu |
| 2017/0069264 A1* | 3/2017 | Dai ..................... G09G 3/3233 |
| 2017/0153759 A1* | 6/2017 | Ding ..................... G06F 3/0418 |
| 2017/0168646 A1* | 6/2017 | Yang ..................... G06F 3/0418 |
| 2017/0177139 A1* | 6/2017 | Yang ..................... G06F 3/0416 |
| 2017/0229070 A1* | 8/2017 | Ma ..................... G09G 3/3266 |

FOREIGN PATENT DOCUMENTS

| | | | |
|---|---|---|---|
| CN | 103578405 A | 2/2014 | |
| CN | 104409047 A | 3/2015 | |
| CN | 104464616 A | 3/2015 | |
| CN | 104835454 A | 8/2015 | |
| CN | 104916257 * | 9/2015 | ............... G09G 3/32 |
| CN | 104933991 A | 9/2015 | |
| CN | 105139804 A | 12/2015 | |

OTHER PUBLICATIONS

International Search Report and Written Opinion for Application No. PCT/CN2016/075117, dated Jun. 27, 2016, 13 Pages.
1$^{st}$ Chinese Office Action, English Translation.
International Search Report and Written Opinion, English Translation.
CN102708819A, English Abstract and U.S. Equivalent U.S. Pat. No. 9,269,300.
CN103383831A, English Abstract and U.S. Equivalent U.S. Pub. No. 2014/225,878.
CN103578405A, English Abstract.
CN104409047A, English Abstract and U.S. Equivalent U.S. Pub. No. 2017/069263.
CN104464616A, English Abstract and U.S. Equivalent U.S. Pub. No. 2016/117983.
CN104835454A, English Abstract.
CN104933991A, English Abstract.
CN105139804A, English Abstract.
Second Office Action for Chinese Application No. 201510628000.0, dated Nov. 10, 2017, 5 Pages.

* cited by examiner

PIXEL DRIVING CIRCUIT, DISPLAY PANEL, METHOD FOR DRIVING DISPLAY PANEL, AND DISPLAY DEVICE THAT COMPENSATES FOR THRESHOLD VOLTAGE DRIFT AND VOLTAGE FLUCTUATION OF A TOUCH DRIVING SIGNAL

CROSS-REFERENCE TO RELATED APPLICATIONS

This application is the U.S. national phase of PCT Application No. PCT/CN2016/075117 filed on Mar. 1, 2016, which claims priority to Chinese Patent Application No. 201510628000.0 filed on Sep. 28, 2015, the disclosures of which are incorporated in their entirety by reference herein.

TECHNICAL FIELD

The present disclosure relates a technical field of displaying, and specifically relates to a pixel driving circuit, a display panel, a method for driving the display panel, and a display device.

BACKGROUND

Comparing with conventional display device, an Organic Light Emitting Diode (OLED), as an electrical-current type light emitting device, is being more and more widely applied in a field of high performance display, due to its advantages of self-emission, quick response, wide view angles, and feasibility of being fabricated on a flexible base. According to the manners to be driven, OLED display devices may be divided into two categories, i.e., a Passive Matrix Driving OLED (PMOLED) and an Active Matrix Driving OLED (AMOLED). The AMOLED has advantages of low production costs, high response speeds, power-savings, capability of being used for direct-current driving in a portable device, and a wide range of operational temperature, and thus the AMOLED display is expected to become a next generation flat panel display in place of a Liquid Crystal Display (LCD).

The current OLED is driven by a Drive Thin Film Transistor (DTFT), which is typically a P-type switch transistor. A gate electrode of the DTFT is connected to a data input terminal $V_{data}$, a source electrode thereof is connected to an input terminal $V_{DD}$ of a constant voltage source, and a drain electrode thereof is connected to the OLED. Because a voltage difference $V_{GS}$ is generated between the voltage $V_{DD}$ at the source electrode and the voltage $V_{data}$ at the gate electrode, the OLED connected to the drain electrode of the DTFT is turned on, and a current for driving the OLED is $I_{OLED}=K(V_{GS}-V_{th})^2$, wherein $V_{th}$ is a threshold voltage of the DTFT, and K is a constant. From the above equation of the current for driving the OLED, it can be seen that, the threshold voltage $V_{th}$ of the DTFT may affect the current $I_{OLED}$ for driving the OLED flowing through the OLED, and due to facts such as errors in the manufacturing processes, and aging of devices, the threshold voltage $V_{th}$ of the DTFT in each pixel unit would drift, thus causing deviation of the current for driving the OLED and adversely affecting display quality. Additionally, with rapid developments of the display technique, display devices with touch functions are increasingly popular due to their merits such as visualized operations. In a type of the conventional OLED display devices, a cathode of an OLED of OLED display device further functions as a touch electrode, so as to reduce an overall thickness of the display device. In case that the cathode functions as the touch electrode, a touch driving signal is required to be applied to the cathode. However, a voltage at the touch driving signal fluctuates with time, such that the current flowing through the OLED is changed and a luminance of the OLED varies with the time, which adversely affects the display quality.

SUMMARY

The embodiments of the present disclosure provide a pixel driving circuit, a display panel, a method for driving the display panel, and a display device, which may prevent a drift of a threshold voltage of a driving transistor from affecting a driving current of an active light-emitting device, and prevent a voltage fluctuation of a touch driving signal with time from affecting display quality.

To achieve the above objective, embodiments of the present disclosure use the following technical solutions.

According to a first aspect of the present disclosure, a pixel driving circuit is provided, which includes a preset unit, a driving unit, a compensation unit, an energy storage unit, and a driving signal output unit. The energy storage unit is connected to a first node and a second node, and configured to store a voltage at the first node and a voltage at the second node. The preset unit is connected to a first voltage terminal, the first node, the second node, a second scanning signal terminal and a reset signal terminal, and configured to, under the control of the second scanning signal terminal, apply a voltage at the first voltage terminal to the first node and apply a voltage at the reset signal terminal to the second node. The compensation unit is connected to a third node, the first node, the second node, a data signal terminal and a first scanning signal terminal, and configured to, under the control of the first scanning signal terminal, apply a data voltage at the data signal terminal to the first node and apply a voltage at the third node to the second node, until the voltage at the second node is compensated to be a voltage difference between the voltage at the first voltage terminal and a threshold voltage of the driving unit. The driving unit is connected to the first voltage terminal, the second node and the third node, and configured to, under the control of the voltage at the first voltage terminal and the voltage at the second node, apply to the third node a driving current for driving an electroluminescent element connected with the pixel driving circuit. The driving signal output unit is connected to the first node, the third node, a reference signal terminal, a third scanning signal terminal and a signal output terminal, and configured to, under the control of the third scanning signal terminal, output a signal from the reference signal terminal to the first node and apply the driving current from the third node to the signal output terminal.

Optionally, the preset unit includes a first transistor and a fourth transistor. A gate electrode of the first transistor is connected to the second scanning signal terminal, a first electrode of the first transistor is connected to the first voltage terminal, and a second electrode of the first transistor is connected to the first node. A gate electrode of the fourth transistor is connected to the second scanning signal terminal, a first electrode of the fourth transistor is connected to the reset signal terminal, and a second electrode of the fourth transistor is connected to the second node.

Optionally, the energy storage unit includes a first capacitor, wherein a first end of the first capacitor is connected to the first node, and a second end of the first capacitor is connected to the second node.

Optionally, the driving unit includes a driving transistor, wherein a gate electrode of the driving transistor is connected to the second node, a first terminal of the driving transistor is connected to the first voltage terminal, and a second terminal of the driving transistor is connected to the third node.

Optionally, the compensation unit includes the third transistor and the fifth transistor, wherein a gate electrode of the third transistor is connected to the first scanning signal terminal, a first electrode of the third transistor is connected to the data signal terminal, and a second electrode of the third transistor is connected to the first node; and a gate electrode of the fifth transistor is connected to the first scanning signal terminal, a first electrode of the fifth transistor is connected to the third node, and a second electrode of the fifth transistor is connected to the second node.

Optionally, the driving signal output unit includes the second transistor and the sixth transistor, wherein a gate electrode of the second transistor is connected to the third scanning signal terminal, a first electrode of the second transistor is connected to the reference signal terminal, and a second electrode of the second transistor is connected to the first node; and a gate electrode of the sixth transistor is connected to the third scanning signal terminal, a first electrode of the sixth transistor is connected to the third node, and a second electrode of the sixth transistor is connected to the signal output terminal.

According to a second aspect of the present disclosure, a display panel is provided, which includes a base, an array of electroluminescent elements formed on the base, an array of pixel driving circuits for driving the array of electroluminescent elements, and a plurality of display driving signal lines for outputting display driving signals to the array of pixel driving circuits; wherein. Each of the pixel driving circuits is the above pixel driving circuit; the array of electroluminescent elements includes a first electrode pattern, a second electrode pattern, and an electroluminescent layer arranged between the first electrode pattern and the second electrode pattern; and the first electrode pattern includes a plurality of first electrodes that are connected to signal output terminals of the pixel driving circuits respectively.

Optionally, the display panel further includes a plurality of touch signal lines, wherein the second electrode pattern includes a plurality of second electrodes that are connected to the plurality of touch signal lines respectively and function as touch electrodes.

Optionally, the plurality of second electrodes are arranged in a plurality of rows, the second electrodes in odd-numbered rows are offset relative to the second electrodes in even-numbered rows in a column direction, the second electrodes in each odd-numbered row are connected to an identical touch signal line, and the second electrodes in a same column and in the even-numbered rows are connected to an identical touch signal line.

Optionally, the first electrodes are anodes of the electroluminescent elements, and the second electrodes are cathodes of the electroluminescent elements.

According to a third aspect of the present disclosure, a method for driving the above display panel is provided, which includes: at a first stage, under the control of the second scanning signal terminal, the present unit applies the voltage at the first voltage terminal to the first node, and applies the voltage at the reset signal terminal to the second node; at a second stage, under the control of the first scanning signal terminal, the compensation unit applies the data voltage at the data signal terminal to the first node, and applies the voltage at the third node to the second node, until the voltage at the second node is compensated to be the voltage difference between the voltage at the first voltage terminal and the threshold voltage of the driving unit; and at a third stage, the driving signal output unit outputs a signal from the reference signal terminal to the first node under the control of the third scanning signal terminal, the driving unit applies to the third node the driving current for driving the electroluminescent element connected to the pixel driving circuit under the control of the voltage at the first voltage terminal and the voltage at the second node, and the driving signal output unit applies the driving current from the third node to the signal output terminal, wherein the third stage includes a touch period in which touch driving signals are outputted to the second electrodes of the second electrode pattern, wherein voltage differences between voltages of the display driving signals applied to the display driving signal lines and voltages of the touch driving signal applied to the touch signal lines do not fluctuate with time.

Optionally, the preset unit includes the first transistor and the fourth transistor, wherein at the first stage, both the first transistor and the fourth transistor are in a turned-on state under the control of the second scanning signal terminal, and the voltage at the first voltage terminal is applied to the first node through the first transistor, and the voltage at the reset signal terminal is applied to the second node through the fourth transistor.

Optionally, the compensation unit includes the third transistor and the fifth transistor, wherein at the second stage, both the third transistor and the fifth transistor are in a turned-on state under the control of the first scanning signal terminal, the data voltage at the data signal terminal is applied to the first node through the third transistor, and the voltage at the third node is applied to the second node through the fifth transistor, until the voltage at the second node is compensated to be the voltage difference between the voltage at the first voltage terminal and the threshold voltage of the driving unit.

Optionally, the driving signal output unit includes the second transistor and the sixth transistor, wherein at the third stage, both the second transistor and the sixth transistor are in a turned-on state under the control of the third scanning signal terminal, it is outputted the signal from the reference signal terminal to the first node through the second transistor, and the driving current from the third node is applied to the signal output terminal through the sixth transistor.

According to a fourth aspect of the present disclosure, a display device is provided, which includes the above display panel.

The present disclosure provides in some embodiments the pixel driving circuit, the display panel, the method for driving the display panel, and the display device. Because the compensation unit may compensate the threshold voltage of the driving unit, it is prevented a drift of the threshold voltage of the driving unit in the pixel driving circuit from adversely affecting the driving current, while the touch driving signals are outputted to the second electrodes in the second electrode pattern in the touch period. In addition, when the display panel including the above pixel driving circuit is driven, the voltage differences between the voltages of the display driving signals applied to the display driving signal lines and the voltages of the touch driving signals do not fluctuate with the time, so as to prevent the fluctuations of the voltages of the touch driving signals with the time from adversely affecting the display quality.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

REFERENCE NUMERALS

Figure 1:
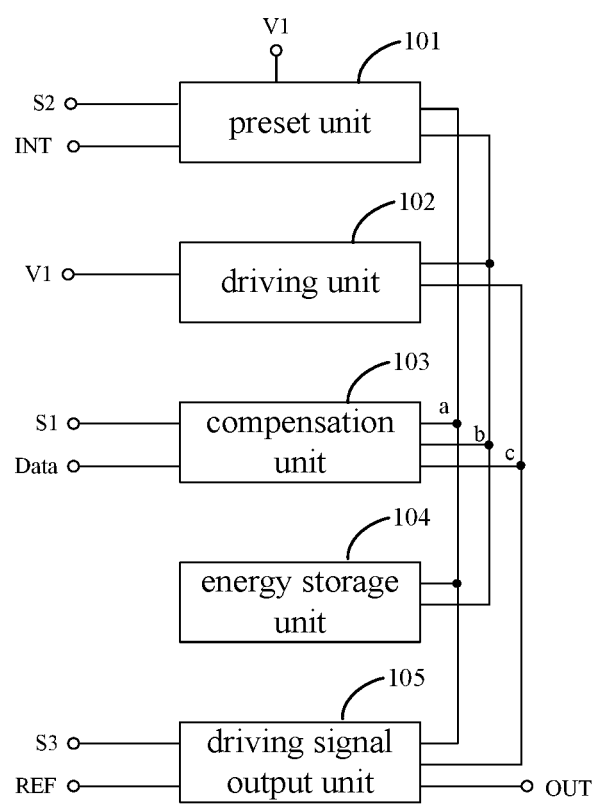
FIG. 1 is a structural schematic diagram of a pixel driving circuit provided in the embodiments of the present disclosure.

10—base, 11—buffer layer, 12—active layer, 12a(12b)—doped active layer, 13—gate insulation layer, 14—gate electrode, 15—interlayer insulation layer, 16a—drain electrode, 16b—source electrode, 16c—touch signal line, 17—planarization layer, 18a—first electrode, 18b—third electrode, 19—pixel definition layer, 20—electroluminescent layer, 21—second electrode, 30—pixel driving circuit; 101—preset unit, 102—driving unit, 103—compensation unit, 104—energy storage unit, 105—driving signal output unit;

T1—first transistor, T2—second transistor, T3—third transistor, T4—fourth transistor, T5—fifth transistor, T6—sixth transistor, DTFT—driving thin film transistor, C—capacitor, OLED—electroluminescent element.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

All of the transistors described in all embodiments of the present disclosure can be thin-film transistors or field effect transistors or other devices having similar characteristics. The transistors used in the embodiments of the present disclosure are mainly switch transistors according to their functions in circuits. Because source electrodes and drain electrodes of the switch transistors used herein are symmetrical, the source electrodes and the drain electrodes thereof are interchangeable. In the embodiments of the present disclosure, in order to differentiate the two electrodes other than the gate electrode of a transistor, the source electrode of the two electrodes is referred to as the first terminal, and the drain electrode of the two electrodes is referred to as the second terminal. In the drawings, a middle terminal of a transistor is the gate electrode, and a terminal for signal input is the source electrode, and a terminal for signal output is the drain electrode. In addition, the switch transistors used in the embodiments of the present disclosure include P-type switch transistors and N-type switch transistors. The P-type switch transistor is turned on when the gate electrodes thereof is at a low level, and is turned off when the gate electrode thereof is at a high level. The N-type switch transistor is turned on when the gate electrode thereof is at a high level, and is turned off when the gate electrode thereof is at a low level. The driving transistors include P-type driving transistors and N-type driving transistors. The P-type driving transistor is in an amplified state or a saturated state when a voltage at the gate electrode thereof is at a low level (i.e., the voltage at the gate electrode thereof is lower than a voltage at the source electrode thereof), and an absolute value of a voltage difference between the voltages of the gate electrode and the source electrode is greater than a threshold voltage. The N-type driving transistor is in the amplified state or the saturated state when a voltage at the gate electrode thereof is at a high level (i.e., the voltage at the gate electrode thereof is higher than a voltage at the source electrode thereof), and an absolute value of a voltage difference between the voltages of the gate electrode and the source electrode is greater than a threshold voltage.

Referring to FIG. 1, the embodiments of the present disclosure provide a pixel driving circuit. The pixel driving circuit includes: a preset unit 101, a driving unit 102, a compensation unit 103, an energy storage unit 104, and a driving signal output unit 105.

The energy storage unit 104 is connected to a first node "a" and a second node "b", and is configured to store voltages at the first node "a" and the second node "b".

The preset unit 101 is connected to a first voltage terminal V1, the first node "a", the second node "b", a second scanning signal terminal S2, and a reset signal terminal INT, and is configured to apply a voltage at the first voltage terminal V1 to the first node "a" and to apply the voltage at the reset signal terminal INT to the second node "b", under the control of the second scanning signal terminal S2.

The compensation unit 103 is connected to a third node "c", the first node "a", the second node "b", a data signal terminal Data, and a first scanning signal terminal S1, and is configured to, under the control of the first scanning signal terminal S1, apply a data voltage at the data signal terminal Data to the first node "a" and apply a voltage at the third node "c" to the second node "b", until the voltage at the second node "b" is compensated to be a voltage difference between the voltage at the first voltage terminal V1 and a threshold voltage of the driving unit 102.

The driving unit 102 is connected to the first voltage terminal V1, the second node "b", and the third node "c", and is configured to apply to the third node "c" a driving current for driving an electroluminescent element connected with the pixel driving circuit, under the control of the voltage at the first voltage terminal V1 and the voltage at the second node "b".

The driving signal output unit 105 is connected to the first node "a", the third node "c", a reference signal terminal REF, a third scanning signal terminal S3 and a signal output terminal OUT, and is configured to output a signal from the reference signal terminal REF to the first node "a" and apply the driving current from the third node "c" to the signal output terminal OUT, under the control of the third scanning signal terminal S3.

The embodiments of the present disclosure provide a display panel, which includes a base, an array of electroluminescent elements formed on the base, an array of pixel driving circuits for driving the electroluminescent elements, and a plurality of display driving signal lines for providing display driving signals to the array of pixel driving circuits.

Each of the pixel driving circuits is the above pixel driving circuit; the array of electroluminescent elements includes a first electrode pattern, a second electrode pattern, and an electroluminescent layer arranged between the first electrode pattern and the second electrode pattern; and the first electrode pattern includes a plurality of first electrodes that are connected to signal output terminals of the pixel driving circuits respectively.

The display panel includes a plurality of touch signal lines, wherein the second electrode pattern includes a plurality of second electrodes that are connected to the plurality of touch signal lines respectively and function as touch electrodes.

Optionally, the plurality of second electrodes are arranged in a plurality of rows, the second electrodes in odd-numbered rows are offset relative to the second electrodes in even-numbered rows in a column direction, the second electrodes in each odd-numbered row are connected to a same touch signal line, and the second electrodes in a same column and in the even-numbered rows are connected to a same touch signal line.

The embodiments of the present disclosure further provide a method for driving the above display panel. The method includes the following three stages:

at a first stage, under the control of the second scanning signal terminal, the present unit applies the voltage at the first voltage terminal to the first node, and applies the voltage at the reset signal terminal to the second node;

at a second stage, under the control of the first scanning signal terminal, the compensation unit applies the data voltage at the data signal terminal to the first node, and applies the voltage at the third node to the second node, until the voltage at the second node is compensated to be the voltage difference between the voltage at the first voltage terminal and the threshold voltage of the driving unit; and at a third stage, the driving signal output unit outputs a signal from the reference signal terminal to the first node under the control of the third scanning signal terminal, the driving unit applies to the third node the driving current for driving the electroluminescent element connected to the pixel driving circuit under the control of the voltage at the first voltage terminal and the voltage at the second node, and the driving signal output unit applies the driving current from the third node to the signal output terminal.

The third stage includes a touch period in which touch driving signals are outputted to the second electrodes of the second electrode pattern, wherein voltage differences between voltages of the display driving signals applied to the display driving signal lines and voltages of the touch driving signal applied to the touch signal lines do not fluctuate with time.

When driving such a display panel, the electroluminescent elements are driven to emit light at the above third stage which includes the touch period. At the time, in the touch period in the third stage, the display driving signal lines are connected to signal terminals of the pixel driving circuits respectively, and the voltage differences between the voltages of display driving signals applied to the display driving signal lines and the voltages of the touch driving signals applied to the touch signal lines are constant.

In this way, it is reduced the impact on the voltages of the display driving signal lines caused by capacitance between the second electrodes and the display driving signal lines when the touch driving signals are transmitted on the second electrodes. Specifically, at the touch period, it enables the voltage at the display driving signal applied to each display driving signal line to fluctuate within a predetermined range, and such fluctuation is synchronized with voltage fluctuation of the touch driving signal applied to the second electrode, and an amplitude of the voltage fluctuation of the display driving signal is equal to an amplitude of the voltage fluctuation of the touch driving signal. Thus, the voltage difference between the voltage at the display driving signal and the voltage of the touch driving signal is constant, and thus it is prevented the capacitance between the second electrode and the display driving signal line from being changed, and the driving current applied to the electroluminescent element by the pixel driving circuit is ensured to be constant at the third stage Thus, because the compensation unit may compensate the threshold voltage of the driving unit, it is prevented a drift of the threshold voltage of the driving unit in the pixel driving circuit from adversely affecting the driving current, while the touch driving signals are outputted to the second electrodes in the second electrode pattern in the touch period. In addition, when the display panel including the above pixel driving circuit is driven, the voltage differences between the voltages of the display driving signals applied to the display driving signal lines and the voltages of the touch driving signals do not fluctuate with the time, so as to prevent the fluctuations of the voltages of the touch driving signals with the time from adversely affecting the display quality.

In actual implementation, the above display panel may have any one of different specific structures, such as the pixel driving circuit therein may take any one of different forms and the driving method thereof may not be the same. This will be exemplified hereinafter with respect to figures.

Figure 2:
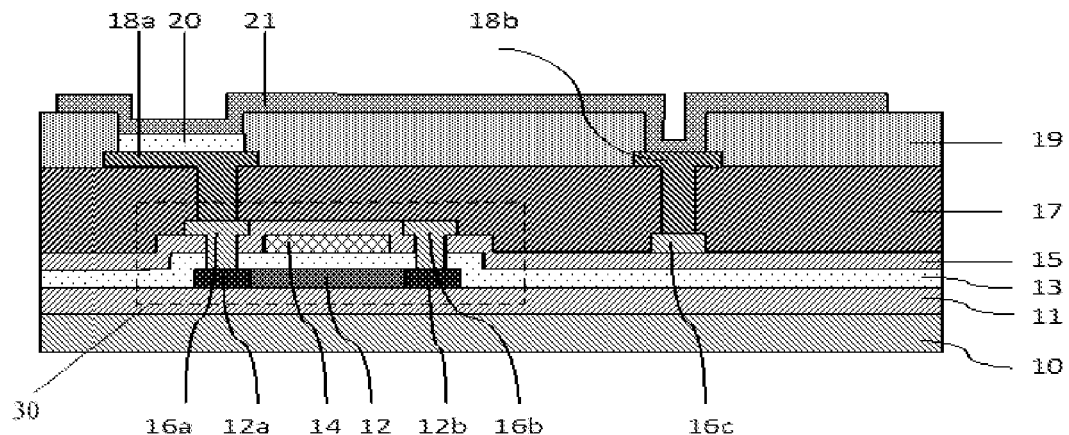
FIG. 2 is a structural schematic diagram of a display panel provided in the embodiments of the present disclosure.
Figure 3:
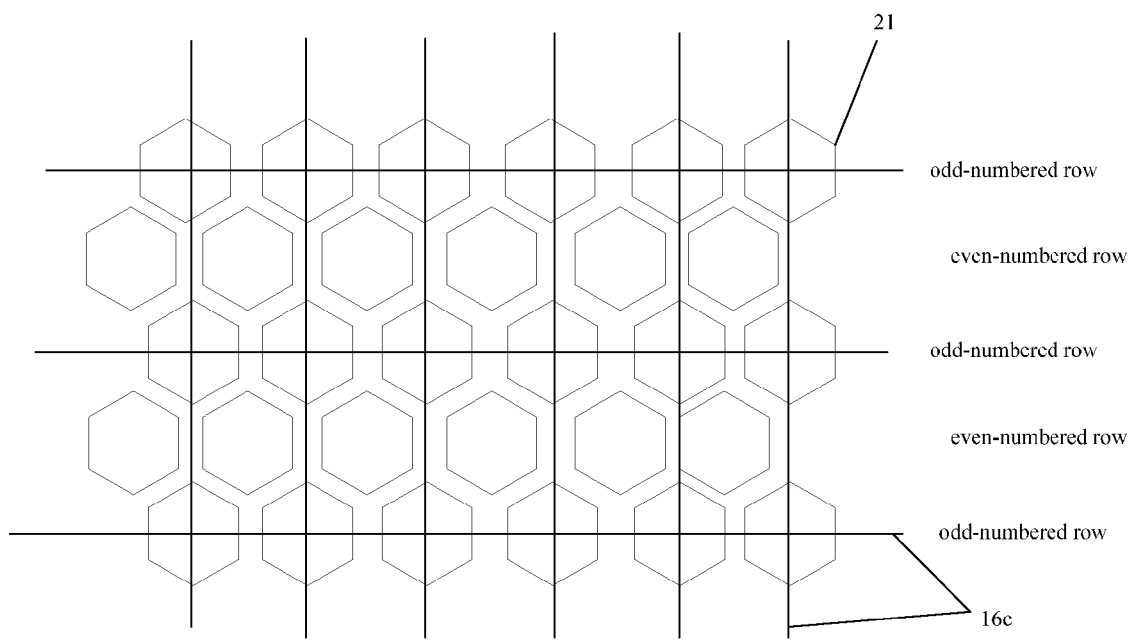
FIG. 3 is a schematic diagram of connection of second electrodes and touch signal lines in the display panel shown in FIG. 2 provided in the embodiments of the present disclosure.

In the actual implementation, the array of electroluminescent elements on the display panel includes the plurality of electroluminescent elements, and the first electrode pattern of the array of electroluminescent elements includes first electrodes (the number of which corresponding to the number of electroluminescent elements), and the first electrode of each of the plurality of electroluminescent elements is connected to one corresponding pixel driving circuit, and each electroluminescent element driven by the pixel driving circuit emits light accordingly. The pixel unit consists of the electroluminescent element and the pixel driving circuit. Additionally, a plurality of display driving signal lines for controlling the plurality of pixel driving circuits is also formed on the display panel. It should be understood that, because requirements for touch precision is lower than requirements for pixel resolution, each of sizes of the second electrodes in the second electrode pattern functioning as the touch electrodes is not necessarily to be a size of one pixel unit, i.e., multiple pixel units may share one second electrode. FIG. 2 is a structural schematic diagram of a pixel unit on the display panel provided by the present disclosure. The pixel unit includes a base 10, a first electrode 18a and a second electrode 21 formed on the base 10, and an electroluminescent layer 20 arranged between the first electrode 18a and the second electrode 21. The first electrode 18a together with the second electrode 21 and the electroluminescent layer 20 thereon implement electroluminescent function. The pixel unit further includes a pixel driving circuit 30 connected to a first electrode 18a. FIG. 2 only shows a structure of one transistor (i.e. the transistor connected to the electroluminescent device) in the pixel driving circuit. It can be understood that other devices in the pixel driving circuit may be formed on the base 10 by using conventional patterning processes. The transistor is a top-gate transistor which includes an active layer 12, doped active layers 12a, 12b, a gate insulation layer 13, a gate electrode 14, an interlayer insulation layer 15, a drain electrode 16a and a source electrode 16b. In addition, FIG. 2 further illustrates a buffer layer 11, a touch signal line 16c connected to the second electrode 21, a planarization layer 17, and a pixel definition layer 19. Additionally, a third electrode 18b connected to the touch signal line 16c through a via hole is also arranged on the planarization layer 17, wherein the first electrode 18a is connected to the drain electrode 16a through a via hole on the planarization layer 17, the second electrode 21 is connected to the third electrode 18b through a via hole in the pixel definition layer 19. In the above structure, the first electrode 18a and the third electrode 18b are formed in a same layer, and the drain electrode 16a, the source electrode 16b and the touch signal line 16c are formed in a same layer. FIG. 3 is a diagram of connection of the second electrodes 21 in the second electrode pattern and the touch signal lines 16c. The positions of the second electrodes 21 in odd-numbered rows are offset relative to the positions of the second electrodes 21 in even-numbered rows, and the second electrodes 21 in each odd-numbered row are connected to a same touch signal line 16c in a row direction, and the second electrodes 21 in the even-numbered rows and in a same column are connected to a same touch signal line 16c in a column direction. In the actual implementation, when a finger touches any touch position, charges stored in the second electrodes 21 (including the second electrodes 21 connected to the touch signal line 16c in the column direction and the second electrodes 21 connected to the touch signal line 16c in the row direction) adjacent to this touch position may vary. Such variation may be detected by the touch signal lines 16c connected to these second electrodes 21, so as to determine the touch position.

Generally, the first electrode 18a herein is an anode of an electroluminescent element, and the second electrode 21 is a cathode of an electroluminescent element. In the embodiments of the present disclosure, the cathodes of the array of electroluminescent elements may further function as the touch electrodes, such that there is no need to form the individual touch electrodes, thereby reducing a cell gap of the display device.

In the actual implementation, the touch signal lines herein may be formed simultaneously with forming elements (such as capacitors and transistors) of the pixel driving circuits. Further, in some cases, the above pixel driving circuit, the first electrode pattern and the electroluminescent layer may be formed on a back plate, and the second electrode pattern may be formed on a cover plate. In such a case, the touch signal lines may be formed on the back plate.

Figure 4:
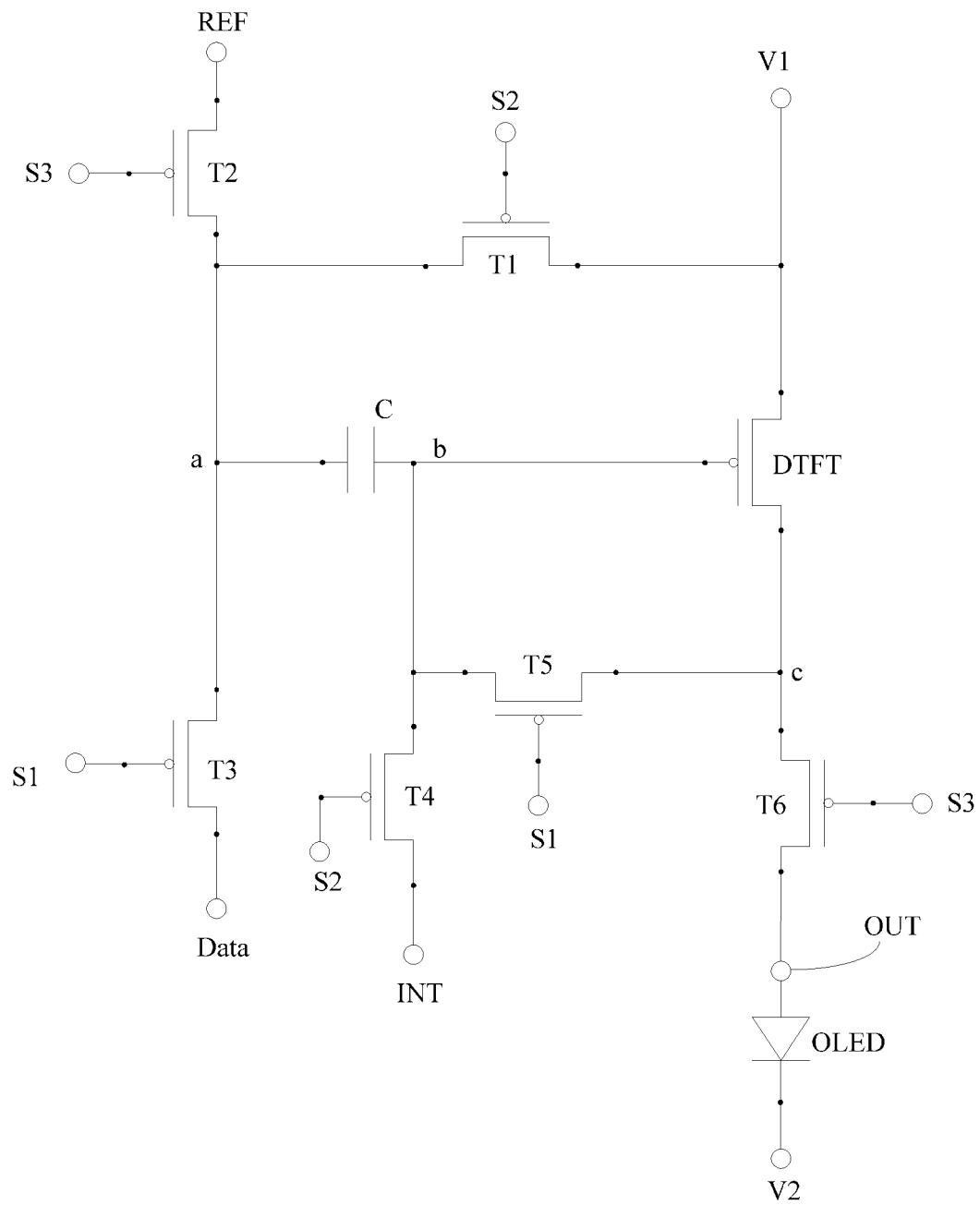
FIG. 4 is a structural schematic diagram of a pixel driving circuit provided in the embodiments of the present disclosure.
Figure 5:
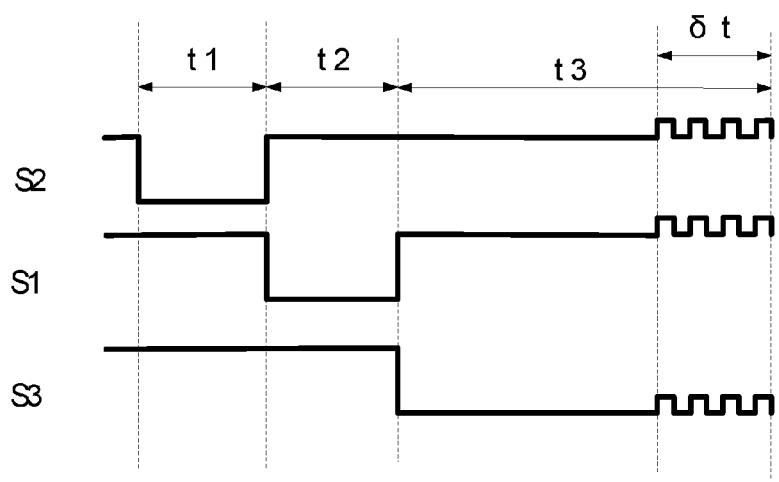
FIG. 5 is a timing diagram of input signals for the pixel driving circuit shown in FIG. 4 provided in the embodiments of the present disclosure.
Figure 6:
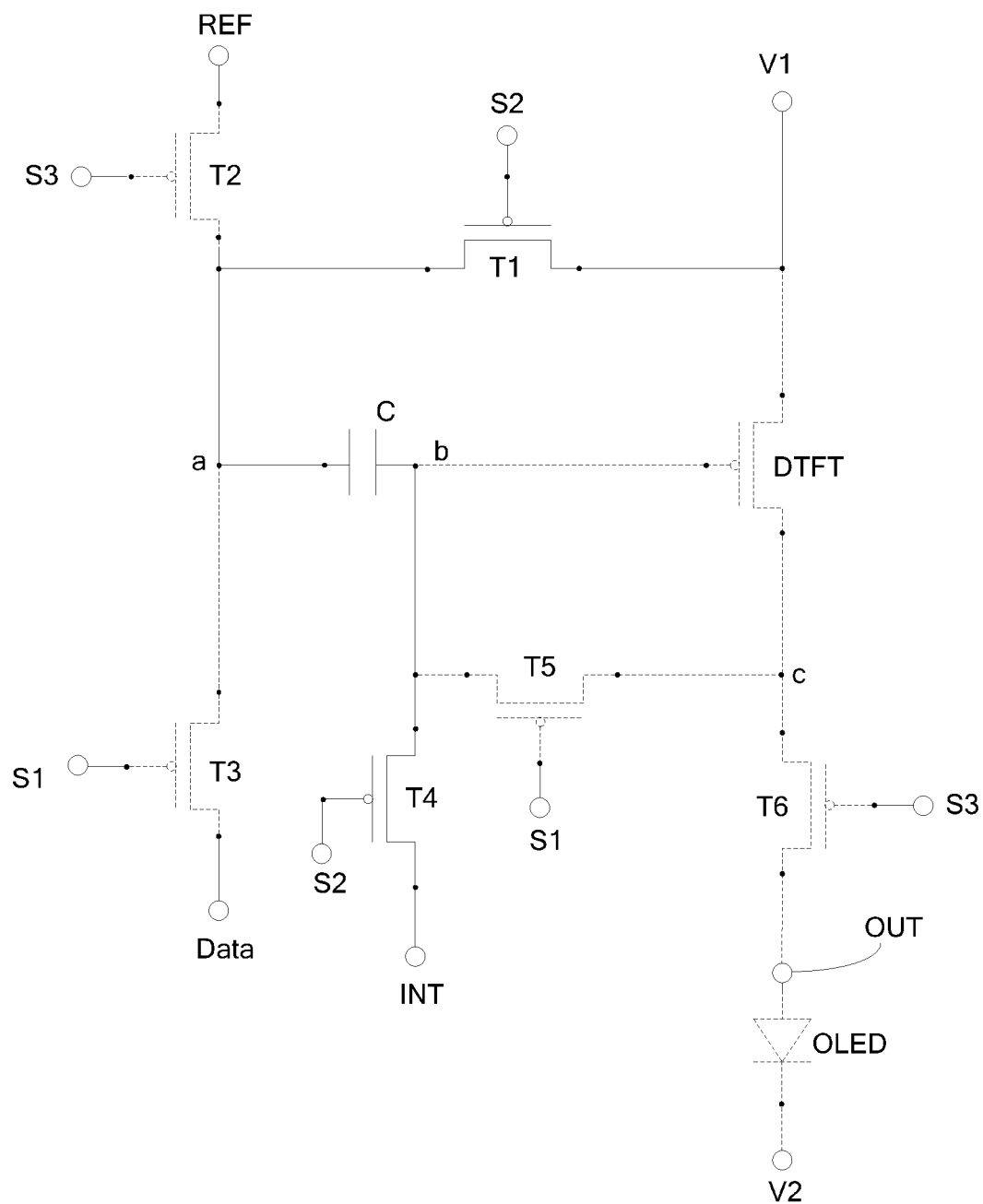
FIG. 6 is a schematic diagram of an equivalent circuit at a stage t1 for the pixel driving circuit shown in FIG. 4 provided in the embodiments of the present disclosure.
Figure 7:
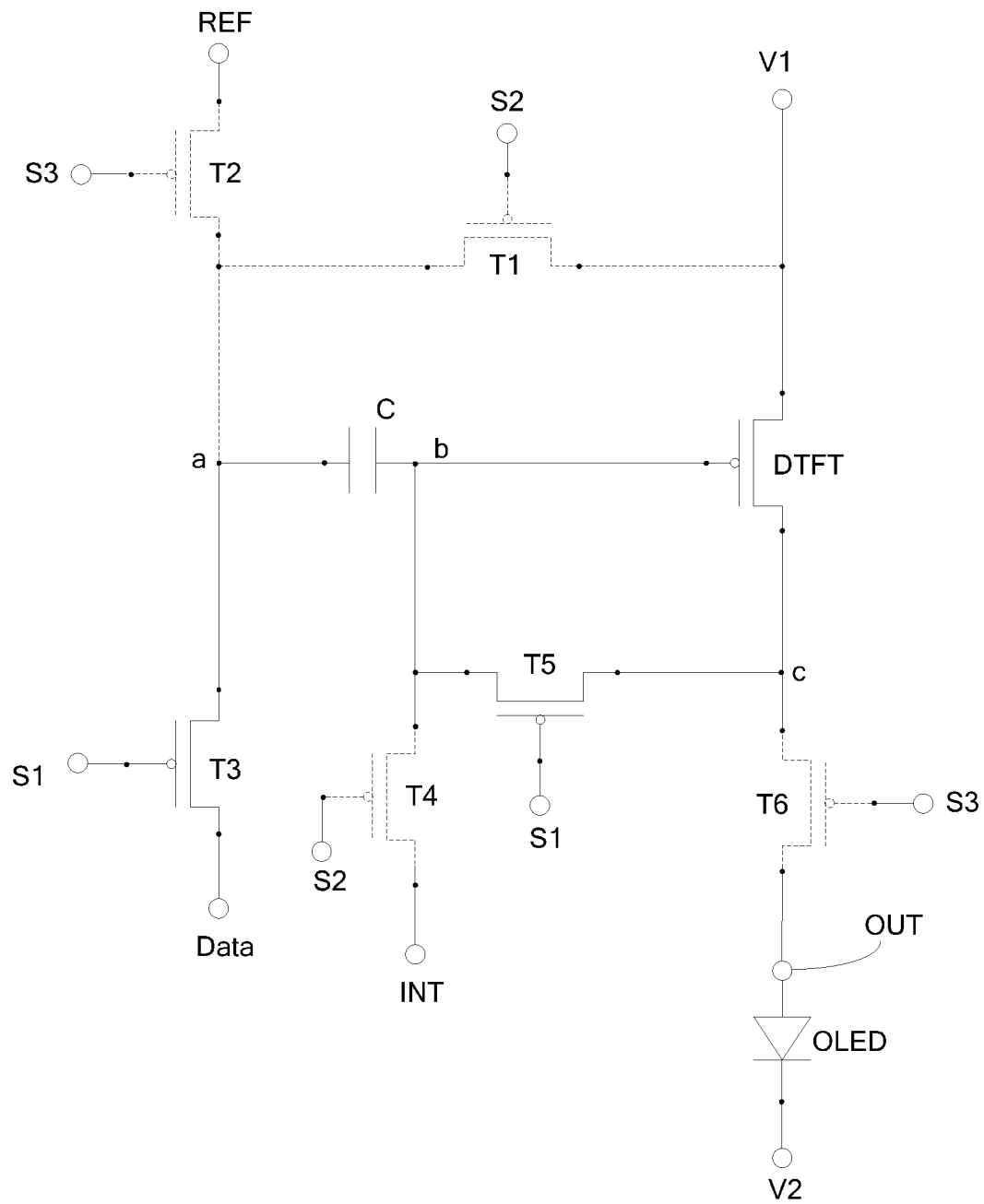
FIG. 7 is a schematic diagram of an equivalent circuit at a stage t2 for the pixel driving circuit shown in FIG. 4 provided in the embodiments of the present disclosure.
Figure 8:
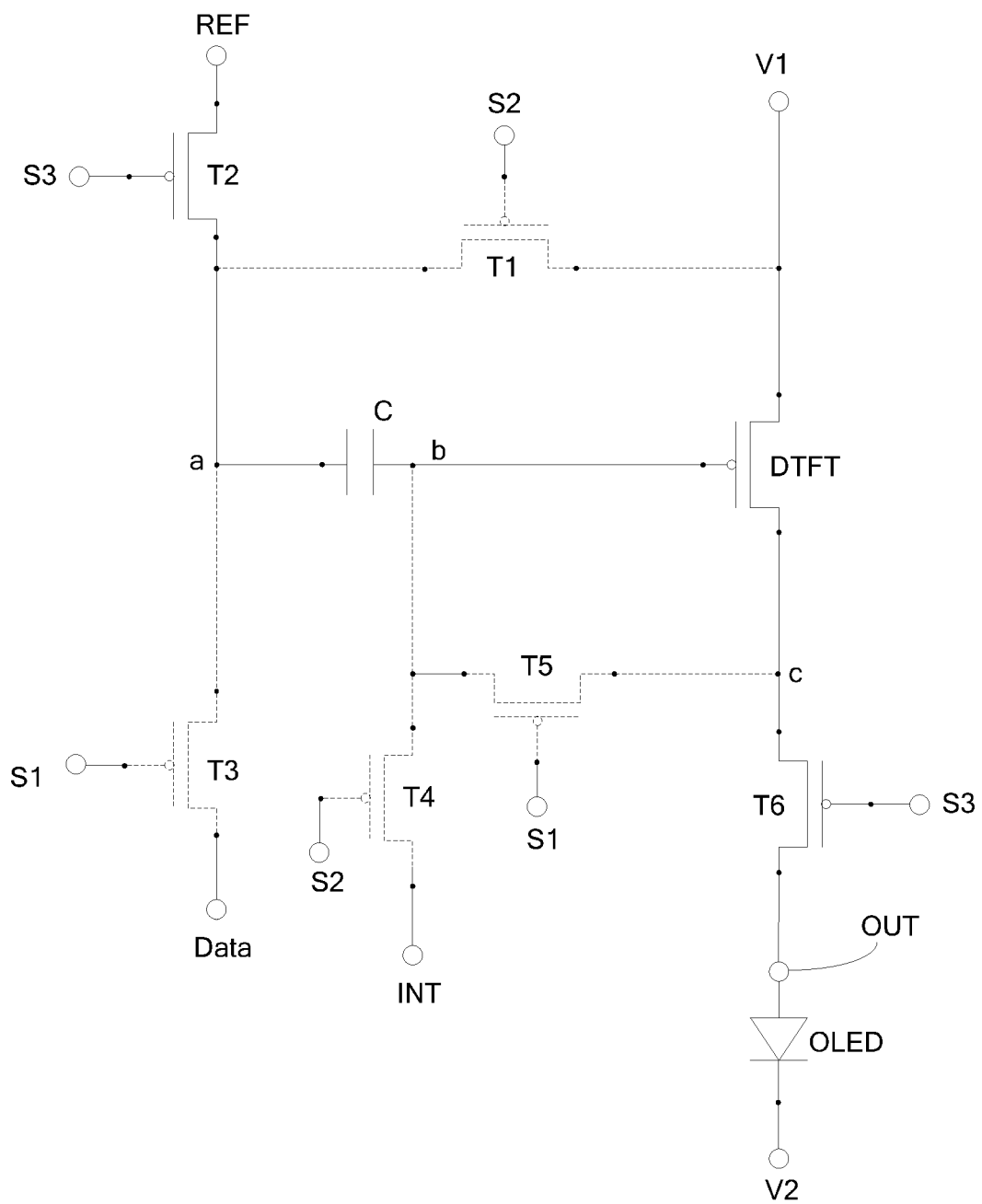
FIG. 8 is a schematic diagram of an equivalent circuit at a stage t3 for the pixel driving circuit shown in FIG. 4 provided in the embodiments of the present disclosure.

Referring to FIG. 4, in the actual implementation, specific structures of units forming the above pixel driving circuit 30 are described as follow: the pixel driving circuit 30 includes six P-type switch transistors T1-T6, one P-type driving transistor DTFT, and one capacitor C, and the pixel driving circuit 30 is connected to an anode of an electroluminescent element OLED. Correspondingly, the display panel includes signal lines for providing signals to signal terminals.

The preset unit 101 includes a first transistor T1 and a fourth transistor T4; a gate electrode of the first transistor T1 is connected to the second scanning signal terminal S2, a first electrode of the first transistor T1 is connected to a first voltage terminal V1, and a second electrode of the first transistor T1 is connected to the first node "a"; a gate electrode of the fourth transistor T4 is connected to the second scanning signal terminal S2, and a first electrode of the fourth transistor T4 is connected to the reset signal terminal INT, and a second electrode of the fourth transistor T4 is connected to second node "b".

The energy storage unit 104 includes a first capacitor C; a first end of the first capacitor C is connected to the first node "a", and a second end of the first capacitor C is connected to the second node "b".

The driving unit 12 includes a driving transistor DTFT; a gate electrode of the driving transistor DTFT is connected to the second node "b", a first terminal of the driving transistor DTFT is connected to the first level terminal V1, and a second terminal of the driving transistor DTFT is connected to the third node "c".

The compensation unit 103 includes a third transistor T3 and a fifth transistor T5; a gate electrode of the third transistor T3 is connected to the first scanning signal terminal S1, a first electrode of the third transistor T3 is connected to the data signal terminal Data, and a second electrode of the third transistor T3 is connected to the first node "a"; a gate electrode of the fifth transistor T5 is connected to the first scanning signal terminal S1, and a first electrode of the fifth transistor T5 is connected to the third node "c", and a second electrode of the fifth transistor T5 is connected to the second node "b".

The driving signal output unit 105 includes a second transistor T2 and a sixth transistor T6; a gate electrode of the second transistor T2 is connected to the third scanning signal terminal S3, and a first electrode of the second transistor T2 is connected to the reference signal terminal REF, and a second electrode of the second transistor T2 is connected to the first node "a"; a gate electrode of the sixth transistor T6 is connected to the third scanning signal terminal S3, a first electrode of the sixth transistor T6 is connected to the third node "c", and a second electrode of the sixth transistor T6 is connected to the signal output terminal OUT.

In the case that pixel circuits in the display panel include the above specific structures of devices, the method for driving the display panel further includes the following features.

Optionally, the preset unit includes the first transistor and the fourth transistor; at a first stage, both the first transistor and the fourth transistor are in a turned-on state under the control of the second scanning signal terminal, and the voltage at the first voltage terminal is applied to the first node through the first transistor and the voltage at the reset signal terminal is applied to the second node through the fourth transistor.

Optionally, the compensation unit includes the third transistor and the fifth transistor; at a second stage, both the third transistor and the fifth transistor are in a turned-on state under the control of the first scanning signal terminal, the data voltage at the data signal terminal is applied to the first node through the third transistor, and the voltage at the third node is applied to the second node through the fifth transistor, until the voltage at the second node is compensated to be the voltage difference between the voltage at the first voltage terminal and the threshold voltage of the driving unit.

Optionally, the driving signal output unit includes the second transistor and the sixth transistor; at a third stage, both the second transistor and the sixth transistor are in a turned-on state under the control of the third scanning signal terminal, the signal from the reference signal terminal is outputted to the first node through the second transistor, and the driving current from the third node is applied to the signal output terminal through the sixth transistor.

The pixel driving circuits in the display panel provided by the embodiments of the present disclosure may prevent a drift of a threshold voltage of a driving transistor from affecting display quality by means of a proper driving method, and may also prevent touch driving signal applied to the cathode from affecting the display quality. An operational principle of the pixel driving circuit shown in FIG. 4 will be discussed in combination with FIGS. 5-8.

The present embodiment is described by assuming that the transistors as the "P-type" transistors, wherein the Terminal V1 is inputted with a high-level VDD signal, the signal output terminal OUT is connected to an anode of an electroluminescent element (for example, an OLED), and the Terminal V2 connected to the cathode of the electroluminescent element is at a low-level VSS. Referring to the pixel driving circuit provided in FIG. 4, timing sequence of input signals of the pixel driving circuit provided in FIG. 5, and the equivalent circuits of the pixel driving circuit at the various stages provided in FIG. 6 to FIG. 8, the operational principle of the display panel may be divided into four parts, i.e., the first stage t1 being a preset stage, the second stage t2 being a threshold voltage and data input stage, and the third stage t3 being a light-emitting stage, wherein the stage t3 includes a δt touch period. The embodiment is discussed with respect to the equivalent circuits shown in FIG. 6 to FIG. 8. A solid line in the figures represents a transistor in the turned-on state or a line that is electrically connected, and a dotted line represents a transistor in the turned-off state or a line that is electrically disconnected.

At the first stage t1: S1=1, S2=0, S3=1. It should be noted that, "0" represents a low level and "1" represents a high level hereinafter. Referring to the equivalent circuit shown in FIG. 6, the S1 and the S3 are high-level OFF signals, and the S2 is a low-level ON signal. In such a case, both T1 and T4 are turned on, and the voltage at the second node "b" is reset to be Vint through the reset signal terminal INT, and the voltage at the first node "a" is reset to be VDD through the reset signal terminal INT, and thereafter, the capacitor C keeps a voltage difference between the node "a" and the node "b". Because the Vint is at a low level, the DTFT is turned on, and because the capacitor C is capable of keeping the voltage difference between the node "a" and the node "b", the DTFT is in a turned-on state from the beginning of the next stage, and it is prepared for threshold compensation.

At the second stage t2, S1=0, S2=1, S3=1. Referring to the equivalent circuit shown in FIG. 7, the S2 and the S3 are high-level OFF signals, and the S1 is a low-level ON signal. In such a case, both the transistor T3 and the transistor T5 are turned on, and the data signal terminal Data charges the node "a" through the transistor T3, until the voltage at the node "a" is changed to be Vdata. Because the transistor T5 is turned on, the gate electrode and the drain electrode of the DTFT are short-connected such that the DTFT functions as a diode, and the electrical potential at the node "b" is charged to be VDD−Vth (satisfying that a voltage difference between the gate electrode and the source electrode of the DTFT is Vth), and at this time, an electrical potential difference between the two ends of the capacitor C is VDD−Vth−Vdata, and it is prepared for the next stage.

At the third stage t3, S1=1, S2=1, S3=0. Referring to the equivalent circuit shown in FIG. 8, the S1 and the S2 are high-level OFF signals, and the S3 is a low-level ON signal. In such a case, both the transistor T2 and the transistor T6 are turned on, the reference signal terminal REF charges the node a to Vref, and the voltage at the node "b" jumps to VDD−Vth−Vdata+Vref. The stage t3 in the timing diagram is a light-emitting stage, at which the voltage at the source electrode of the DTFT is VDD, and the electrical current passes through the DTFT and the transistor T6 to enable the OLED to emit light.

It may be obtained from a current saturation equation of the DTFT that:

$$I_{OLED} = K(V_{GS} - V_{th})^2$$
$$= K[VDD - [VDD - Vth - Vdata + Vref] - Vth]^2$$
$$= K(Vdata - Vref)^2$$

From the above equation, it can be seen that an operational electrical current IOLED is not affected by Vth at this time, such that it is completely solved the problem of the drift of the threshold voltage Vth of the DTFT due to the manufacturing process and long operation time, and the impaction on the IOLED by the drift is eliminated, and the OLED is ensured to operate normally.

In the δt touch period in the third stage t3, except that the cathode (the second electrode, i.e. the touch electrode) is inputted with the touch driving signal to start to be driven, other display driving signal lines are driven together with the touch electrode, so as to assure that all TFTs are in their original ON/OFF states. Meanwhile, an amplitude of the electrical current applied by the OLED is not affected, because the node "a" has been inputted with the data signal at the whole light-emitting stage. Because both the voltage VDD and the voltages of other display driving signal lines including the voltage Vint jump with the touch driving signal of the touch electrode, the node "a" is in a floating state and also jumps with the voltage Vint. Thus, the electrical current $I_{OLED}$ outputted at the output terminal is not affected.

Additionally, it should be understood that in the embodiment of the present disclosure, the transistors are set to be P-type transistors to simplify the manufacturing process. However, in practice, the types of the transistors are not limited thereto, while similar technical solutions may be obtained to implement the principle of the present disclosure, and thus fall into the scope of the present disclosure.

The present disclosure also provides a display device including the above mentioned display panel.

The display device herein may be any product or component having a display function such as an electronic paper, a mobile phone, a tablet computer, a television, a monitor, a laptop computer, or a navigator.

The above are merely specific embodiments of the present disclosure. However, the protection scope of the present disclosure is not limited thereto. Any variations or replacements anticipated by those skilled in the art under the teaching of the present disclosure will fall into the protection scope of the present disclosure. Thus, the protection scope of the present disclosure should be defined by the claims.

What is claimed is:

1. A pixel driving circuit, comprising a preset circuit, a driving circuit, a compensation circuit, an energy storage circuit, and a driving signal output circuit, wherein
the energy storage circuit is connected to a first node and a second node, and configured to store a voltage at the first node and a voltage at the second node;
the preset circuit is connected directly to each of a first voltage terminal, the first node, the second node, a second scanning signal terminal and a reset signal terminal, and configured to, under the control of the second scanning signal terminal, apply a voltage at the first voltage terminal to the first node and apply a voltage at the reset signal terminal to the second node;
the compensation circuit is connected to a third node, the first node, the second node, a data signal terminal and a first scanning signal terminal, and configured to, under the control of the first scanning signal terminal, apply a data voltage at the data signal terminal to the first node and apply a voltage at the third node to the second node, until the voltage at the second node is compensated to be a voltage difference between the voltage at the first voltage terminal and a threshold voltage of the driving circuit;
the driving circuit is connected to the first voltage terminal, the second node and the third node, and configured to, under the control of the voltage at the first voltage terminal and the voltage at the second node, apply to the third node a driving current for driving an electroluminescent element connected with the pixel driving circuit; and
the driving signal output circuit is connected to the first node, the third node, a reference signal terminal, a third scanning signal terminal and a signal output terminal, and configured to, under the control of the third scanning signal terminal, output a signal from the reference signal terminal to the first node and apply the driving current from the third node to the signal output terminal,
wherein the preset circuit is consisted of a first transistor and a fourth transistor, wherein
a gate electrode of the first transistor is connected directly to the second scanning signal terminal, a first electrode of the first transistor is connected directly to the first voltage terminal, and a second electrode of the first transistor is connected directly to the first node; and
a gate electrode of the fourth transistor is connected directly to the second scanning signal terminal, a first electrode of the fourth transistor is connected directly to the reset signal terminal, and a second electrode of the fourth transistor is connected directly to the second node.

2. The pixel driving circuit according to claim 1, wherein the energy storage circuit comprises a first capacitor, wherein a first end of the first capacitor is connected to the first node, and a second end of the first capacitor is connected to the second node.

3. The pixel driving circuit according to claim 1, wherein the driving circuit comprises a driving transistor, wherein
a gate electrode of the driving transistor is connected to the second node, a first electrode of the driving transistor is connected to the first voltage terminal, and a second electrode of the driving transistor is connected to the third node.

4. The pixel driving circuit according to claim 1, wherein the compensation circuit comprises a third transistor and a fifth transistor, wherein
a gate electrode of the third transistor is connected to the first scanning signal terminal, a first electrode of the third transistor is connected to the data signal terminal, and a second electrode of the third transistor is connected to the first node; and
a gate electrode of the fifth transistor is connected to the first scanning signal terminal, a first electrode of the fifth transistor is connected to the third node, and a second electrode of the fifth transistor is connected to the second node.

5. The pixel driving circuit according to claim 1, wherein the driving signal output circuit comprises a second transistor and a sixth transistor, wherein
a gate electrode of the second transistor is connected to the third scanning signal terminal, a first electrode of the second transistor is connected to the reference signal terminal, and a second electrode of the second transistor is connected to the first node; and
a gate electrode of the sixth transistor is connected to the third scanning signal terminal, a first electrode of the sixth transistor is connected to the third node, and a second electrode of the sixth transistor is connected to the signal output terminal.

6. A display panel, comprising a base, an array of electroluminescent elements formed on the base, an array of pixel driving circuits for driving the array of electroluminescent elements, and a plurality of display driving signal lines for outputting display driving signals to the array of pixel driving circuits; wherein
each of the pixel driving circuits is the pixel driving circuit according to claim 1; the array of electroluminescent elements comprises a first electrode pattern, a second electrode pattern, and an electroluminescent layer arranged between the first electrode pattern and the second electrode pattern; and the first electrode pattern comprises a plurality of first electrodes that are connected to signal output terminals of the pixel driving circuits respectively.

7. The display panel according to claim 6, further comprising a plurality of touch signal lines, wherein the second electrode pattern comprises a plurality of second electrodes that are connected to the plurality of touch signal lines respectively and function as touch electrodes.

8. The display panel according to claim 7, wherein the plurality of second electrodes are arranged in a plurality of rows, the second electrodes in odd-numbered rows are offset relative to the second electrodes in even-numbered rows in a column direction, the second electrodes in each odd-numbered row are connected to a same touch signal line, and the second electrodes in a same column and in the even-numbered rows are connected to a same touch signal line.

9. The display panel according to claim 7, wherein the first electrodes are anodes of the electroluminescent elements, and the second electrodes are cathodes of the electroluminescent elements.

10. A method for driving the display panel according to claim 6, comprising:
at a first stage, under the control of the second scanning signal terminal, the preset circuit applies the voltage at the first voltage terminal to the first node, and applies the voltage at the reset signal terminal to the second node;
at a second stage, under the control of the first scanning signal terminal, the compensation circuit applies the data voltage at the data signal terminal to the first node, and applies the voltage at the third node to the second node, until the voltage at the second node is compensated to be the voltage difference between the voltage at the first voltage terminal and the threshold voltage of the driving circuit; and
at a third stage, the driving signal output circuit outputs a signal from the reference signal terminal to the first node under the control of the third scanning signal terminal, the driving circuit applies to the third node the driving current for driving the electroluminescent element connected to the pixel driving circuit under the control of the voltage at the first voltage terminal and the voltage at the second node, and the driving signal output circuit applies the driving current from the third node to the signal output terminal, wherein
the third stage comprises a touch period in which touch driving signals are outputted to the second electrodes of the second electrode pattern, wherein voltage differences between voltages of the display driving signals applied to the display driving signal lines and voltages of the touch driving signal applied to touch signal lines do not fluctuate with time.

11. The method according to claim 10, wherein
at the first stage, both the first transistor and the fourth transistor are in a turned-on state under the control of the second scanning signal terminal, and the voltage at the first voltage terminal is applied to the first node through the first transistor, and the voltage at the reset signal terminal is applied to the second node through the fourth transistor.

12. The method according to claim 10, wherein the compensation circuit comprises a third transistor and a fifth transistor, wherein
at the second stage, both the third transistor and the fifth transistor are in a turned-on state under the control of the first scanning signal terminal, the data voltage at the data signal terminal is applied to the first node through the third transistor, and the voltage at the third node is applied to the second node through the fifth transistor, until the voltage at the second node is compensated to be the voltage difference between the voltage at the first voltage terminal and the threshold voltage of the driving circuit.

13. The method according to claim 10, wherein the driving signal output circuit comprises a second transistor and a sixth transistor, wherein
at the third stage, both the second transistor and the sixth transistor are in a turned-on state under the control of the third scanning signal terminal, it is outputted the signal from the reference signal terminal to the first node through the second transistor, and the driving current from the third node is applied to the signal output terminal through the sixth transistor.

14. A display device comprising the display panel according to claim 6.

15. The display panel according to claim 6, wherein the energy storage circuit comprises a first capacitor, wherein
a first end of the first capacitor is connected to the first node, and a second end of the first capacitor is connected to the second node.

16. The display panel according to claim 6, wherein the driving circuit comprises a driving transistor, wherein
a gate electrode of the driving transistor is connected to the second node, a first electrode of the driving transistor is connected to the first voltage terminal, and a second electrode of the driving transistor is connected to the third node.

17. The display panel according to claim 6, wherein the compensation circuit comprises a third transistor and a fifth transistor, wherein
a gate electrode of the third transistor is connected to the first scanning signal terminal, a first electrode of the third transistor is connected to the data signal terminal, and a second electrode of the third transistor is connected to the first node; and
a gate electrode of the fifth transistor is connected to the first scanning signal terminal, a first electrode of the fifth transistor is connected to the third node, and a second electrode of the fifth transistor is connected to the second node.

18. The display panel according to claim 6, wherein the driving signal output circuit comprises a second transistor and a sixth transistor, wherein
a gate electrode of the second transistor is connected to the third scanning signal terminal, a first electrode of the second transistor is connected to the reference signal terminal, and a second electrode of the second transistor is connected to the first node; and
a gate electrode of the sixth transistor is connected to the third scanning signal terminal, a first electrode of the sixth transistor is connected to the third node, and a second electrode of the sixth transistor is connected to the signal output terminal.

* * * * *